United States Patent
Kobayashi et al.

(10) Patent No.: US 6,801,449 B2
(45) Date of Patent: Oct. 5, 2004

(54) SEMICONDUCTOR MEMORY DEVICE

(75) Inventors: Hiroyuki Kobayashi, Kawasaki (JP); Mototsugu Hamada, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/781,905

(22) Filed: Feb. 20, 2004

(65) Prior Publication Data

US 2004/0160803 A1 Aug. 19, 2004

Related U.S. Application Data

(62) Division of application No. 10/154,967, filed on May 28, 2002, now Pat. No. 6,714,439.

(30) Foreign Application Priority Data

May 29, 2001 (JP) ........................................ 2001-159944

(51) Int. Cl.[7] ............................ G11C 11/00; G11C 11/34
(52) U.S. Cl. .......................... 365/154; 365/148; 365/188
(58) Field of Search ................................ 365/154, 148, 365/188

(56) References Cited

U.S. PATENT DOCUMENTS

| | | | | |
|---|---|---|---|---|
| 5,524,095 A | * | 6/1996 | Someya et al. | 365/189.09 |
| 5,604,707 A | * | 2/1997 | Kuge et al. | 365/226 |
| 5,708,599 A | * | 1/1998 | Sato et al. | 365/154 |
| 5,953,261 A | * | 9/1999 | Furutani et al. | 365/189.05 |
| 6,046,627 A | * | 4/2000 | Itoh et al. | 327/546 |
| 6,115,296 A | * | 9/2000 | Ando | 365/189.09 |
| 6,177,694 B1 | * | 1/2001 | El Hajji | 257/296 |

OTHER PUBLICATIONS

Fariborz Assaderaghi et al. "A Dynamic Threshold voltage MOSFET (DTMOS) for Very Low voltage Operation", IEEE Electron Device Letters, vol. 15, No. 12, Dec. 1994, pp. 510–512.

In–Young Chung, et al. "A New SOI Inverter Using Dynamic Thershold for Low–Power Applications", IEEE Electron Device Letters, vol. 18, No. 6, Jun. 1997, pp. 248–250.

* cited by examiner

*Primary Examiner*—David Nelms
*Assistant Examiner*—Ly Duy Pham
(74) *Attorney, Agent, or Firm*—Oblon, Spivak, McClelland, Maier & Neustadt, P.C.

(57) ABSTRACT

A semiconductor memory device according to an aspect of the present invention includes memory cells each having a data storage section which stores data and a transfer gate section which has a MOSFET of a first conductive type for writing the data to the data storage section and reading the data from the data storage section, wherein a potential corresponding to the data stored in the data storage section is applied as a substrate bias of the MOSFET.

3 Claims, 6 Drawing Sheets

USE OF ORDINARY SEMICONDUCTOR SUBSTRATE

USE OF SOI SUBSTRATE

SEMICONDUCTOR MEMORY DEVICE

CROSS-REFERENCE TO RELATED APPLICATION

This application is a divisional of and claims the benefit of priority under 35 USC §120 from U.S. Ser. No. 10/154,967, filed May 28, 2002 now U.S. Pat. No. 6,714,439, and is based upon and claims the benefit of priority under 35 USC §119 from Japanese Patent Application No. 2001-159944, filed May 29, 2001; the entire contents of which are incorporated herein by reference.

BACKGROUND OF THE INVENTION

1. Field of the Invention

The present invention relates to a semiconductor memory device.

2. Description of Related Art

Generally, one of the effective methods of reducing the power consumption of a semiconductor integrated circuit including MOSFET's, particularly the power consumption of a CMOS integrated circuit, is to decrease a driving voltage. If the driving voltage is decreased, however, the operating speed of the CMOS circuit is reduced. If not only the driving voltage but also a threshold voltage is decreased, it is possible to reduce the power consumption of the circuit in operation without reducing the operating speed thereof. If the threshold is decreased, however, the sub-threshold current of each MOSFET increases and the power consumption of the circuit in a standby state thereby increases. Particularly, in a semiconductor memory device, if the driving voltage thereof is to be decreased, such disadvantages as the decrease of a gain in an operating range of a CMOS device which constitutes a memory cell, the increase of a stand-by current following the decrease of the threshold Vth of each MOSFET occur. To avoid these disadvantages, there is proposed the use of DTMOS's (Dynamic Threshold voltage MOSFET's) each having a gate connected to a substrate, as MOSFET's which constitute a memory cell. If the DTMOS's are used, it is possible to decrease a stand-by current and to obtain a large gain at a low driving voltage. It is, therefore, possible to configure a circuit which can stably operate at high speed.

The configuration and layout of a conventional memory cell which uses CMOS devices as constituent elements are shown in FIGS. 8 and 9, respectively. The configuration and layout of a conventional memory cell which uses DTMOS's as constituent elements are shown in FIGS. 10 and 11, respectively.

In FIG. 8, a memory cell 70 includes two transfer gates 72 and 73, and a data storage section 80. The data storage section 80 includes a CMOS inverter 83 which consists of a p channel MOSFET 81 and an n channel MOSFET 82, and a CMOS inverter 86 which consists of a p channel MOSFET 84 and an n channel MOSFET 85. The input terminal of the CMOS inverter 83 is connected to the output terminal of the CMOS inverter 86. The output terminal of the CMOS inverter 83 is connected to the input terminal of the CMOS inverter 86. Therefore, the CMOS inverters 83 and 86 constitute a cross-connection configuration. Each of the transfer gates 72 and 73 consists of an n channel MOSFET and the gate thereof is connected to a word line WL.

In addition, the drain of the transfer gate 72 is connected to a bit line BL and the source thereof is connected to the output terminal of the CMOS inverter 83, i.e., the drains of the MOSFET's 81 and 82. The drain of the transfer gate 73 is connected to a bit line/BL and the source thereof is connected to the output terminal of the CMOS inverter 86, i.e., the drains of the MOSFET's 84 and 85. Further, a well or a substrate in which the transfer gates 72 and 73 are formed is connected to the sources of the MOSFET's 82 and 85.

In the memory cell 70 constituted as stated above, the transfer gates 72 and 73 and the n channel MOSFET's 82 and 85 are formed in the same well 101 and the p channel MOSFET's 81 and 84 are formed in the same well 102 as shown in FIG. 9. The gates of the transfer gates 72 and 73 are configured as the word line WL of, for example, polysilicon. A diffused layer 72*b* which becomes the drain of the transfer gate 72 is connected to the bit line BL and a diffused layer 72*a* which becomes the source of the transfer gate 72, becomes the drain of the MOSFET 82. A diffused layer 73*b* which becomes the drain of the transfer gate 73 is connected to the bit line/BL and a diffused layer 73*a* which becomes the source of the transfer gate 73, becomes the drain of the MOSFET 85. Diffused layers 82*a* and 85*a* which become the sources of the MOSFET's 82 and 85 are connected to the well 101 and a ground power supply by wirings, respectively.

Further, the gates of the MOSFET's 81 and 82 are configured as a wiring 105 of, for example, polysilicon. This wiring 105 is connected to diffused layers 84*b* and 73*a* which become the drains of the MOSFET's 84 and 85, respectively. The gates of the MOSFET's 84 and 85 are constituted as a wiring 106 made of, for example, polysilicon. This wiring 106 is connected to diffused layers 81*b* and 72*a* which become the drains of the MOSFET's 81 and 82, respectively. Diffused layers 81*a* and 84*a* which become the sources of the MOSFET's 81 and 84, respectively, are connected to the well 102 and a driving power supply.

Meanwhile, as shown in FIG. 10, the conventional memory cell which uses DTMOS's includes two transfer gates 76 and 77, and a data storage section 90. The data storage section 90 includes a CMOS inverter 93 which consists of a p channel MOSFET 91 and an n channel MOSFET 92, and a CMOS inverter 96 which consists of a p channel MOSFET 94 and an n channel MOSFET 95. The input terminal of the CMOS inverter 93 is connected to the output terminal of the CMOS inverter 96. The output terminal of the CMOS inverter 93 is connected to the input terminal of the CMOS inverter 96. In addition, the potential of the input terminal of the CMOS inverter 93 is applied as the substrate bias of the CMOS inverter 93. The potential of the input terminal of the CMOS inverter 96 is applied as the substrate bias of the CMOS inverter 96.

Each of the transfer gates 76 and 77 consists of an n channel MOSFET and the gate thereof is connected to a word line WL. The drain of the transfer gate 76 is connected to a bit line BL, and the source thereof is connected to the output terminal of the CMOS inverter 93, i.e., the drains of the MOSFET's 91 and 92. The drain of the transfer gate 77 is connected to a bit line/BL, and the source thereof is connected to the output terminal of the CMOS inverter 96, i.e., the drains of the MOSFET's 94 and 95. A well or a substrate in which the transfer gate 76 is formed is connected to the gate of the transfer gate 76 or the substrate. A well or a substrate in which the transfer gate 77 is formed is connected to the gate of the transfer gate 77 or the substrate.

In the memory cell 90 constituted as stated above, as shown in FIG. 11, the transfer gates 76 and 77, the n channel MOSFET's 92 and 95, and the p channel MOSFET's 91 and 94 are formed in different wells. Namely, the transfer gate 76 is formed in a well 111, the transfer gate 77 is formed in a well 112, the MOSFET 92 is formed in a well 113, the MOSFET 95 is formed in a well 114, the MOSFET 91 is formed in a well 115, and the MOSFET 94 is formed in a well 116.

The gates of the transfer gates 76 and 77 are configured as a word line WL of, for example, polysilicon. In addition, a diffused layer 76b which becomes the drain of the transfer gate 76, is connected to the bit line BL. A diffused layer 76a which becomes the source of the transfer gate 76 is connected to diffused layers 91b and 92b which become the drains of the MOSFET's 91 and 92, respectively, and also connected to a wiring 122 of, for example, polysilicon which becomes the gates of the MOSFET's 94 and 95. A diffused layer 77b which becomes the drain of the transfer gate 77 is connected to a bit line /BL. A diffused layer 77a which becomes the source of the transfer gate 77 is connected to diffused layers 94b and 95b which become the drains of the MOSFET's 94 and 95, respectively and also connected to a wiring 121 of, for example, polysilicon which becomes the gates of the MOSFET's 91 and 92. Diffused layers 92a and 95a which become the sources of the MOSFET's 92 and 95 are connected to a ground power supply by wirings, respectively. Diffused layers 91a and 94a which become the sources of the MOSFET's 91 and 94 are connected to a driving power supply by wirings, respectively.

The word line WL which becomes the gates of the transfer gates 76 and 77 contacts with the wells 111 and 112. The wiring 121 which becomes the gates of the MOSFET's 91 and 92 contacts with the wells 113 and 115. The wiring 122 which becomes the gates of the MOSFET's 94 and 95 contacts with the wells 114 and 116.

As can be seen, the conventional memory cell which employs DTMOS's as constituent elements is required to form the wells of respective transistors independently of one another in light of a substrate bias, thereby disadvantageously increasing the area of the memory cell compared with the memory cell which employs CMOS devices as constituent elements.

Further, in the memory cell which consists of two inverters and two transfer gates, one of the two bit lines always becomes H level and the other bit line always becomes L level when data is read from the cell. If a current is not applied to the transfer gate on the H level side, the potential difference between the bit lines has sharp change and high speed operation can be performed. However, in the conventional memory cell which employs DTMOS's, the two transfer gates are simultaneously opened and closed and equal in operating characteristic, making it disadvantageously impossible to perform high speed operation.

SUMMARY OF THE INVENTION

A semiconductor memory device according to a first aspect of the present invention comprises a plurality of memory cells each comprising: a data storage section storing data; and a transfer gate section having a MOSFET of a first conductive type for writing the data to the data storage section and reading the data from the data storage section, and wherein a potential corresponding to the data stored in the data storage section is applied as a substrate bias of the MOSFET.

A semiconductor memory device according to a second aspect of the present invention comprises a plurality of memory cells each comprising: first to fourth wells formed on a semiconductor substrate and isolated from one another; a first MOSFET of a first conductive type formed in the first well, having a diffused layer becoming a drain and connected to one of a pair of bit lines, and having a gate connected to a word line; a second MOSFET of the first conductive type formed in the first well, having a diffused layer becoming a drain, the diffused layer being a common diffused layer becoming a source of the first MOSFET; a third MOSFET of the first conductive type formed in the second well, having a diffused layer becoming a drain and connected to the other bit line of the pair of bit lines, and having a gate connected to the word line; a fourth MOSFET of the first conductive type formed in the second well, having a diffused layer becoming a drain, the diffused layer being a common diffused layer becoming a source of the third MOSFET; a fifth MOSFET of a second conductive type formed in the third well, and having a gate common to the fifth MOSFET and the second MOSFET; a sixth MOSFET of the second conductive type formed in the fourth well, and having a gate common to the sixth MOSFET and the fourth MOSFET; a first wiring connecting a diffused layer becoming a source of the second MOSFET to a diffused layer becoming the drain of the fifth MOSFET; a second wiring connecting a diffused layer becoming a source of the fourth MOSFET to a diffused layer becoming a drain of the sixth MOSFET; a first contact section formed in an isolation region isolating the first well from the third well, and connecting the first wiring to the gates of the fourth and sixth MOSFET's; and a second contact section formed in an isolation region isolating the second well from the fourth well, and connecting the second wiring to the gates of the second and fifth MOSFET, and wherein the first well is connected to the third well through the gates of the second and fifth MOSFET's, and the second well is connected to the fourth well through the gates of the fourth and sixth MOSFET's.

DESCRIPTION OF THE EMBODIMENTS

Figure 1:
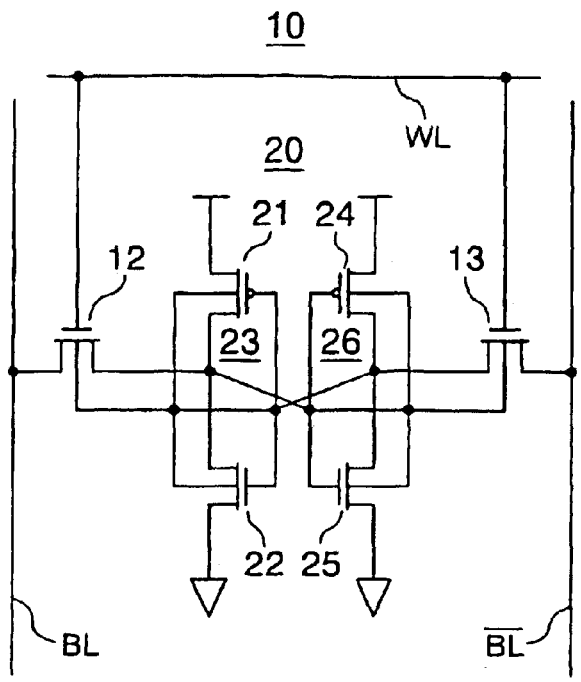
FIG. 1 is a circuit diagram showing the configuration of a memory cell in a semiconductor memory device according to the first embodiment of the present invention.

The embodiments of a semiconductor memory device according to the present invention will be described hereinafter with reference to the drawings.

First Embodiment

A semiconductor memory device according to the first embodiment of the present inventing will be described with reference to FIGS. 1, 2, 3A and 3B. The semiconductor memory device according to the first embodiment has a plurality of memory cells arranged in a matrix. The configuration and layout of a memory cell will be shown in FIGS. 1 and 2, respectively. This memory cell 10 includes two transfer gates 12 and 13, and a data storage section 20. The data storage section 20 includes a CMOS inverter 23 which consists of a p channel MOSFET 21 and an n channel MOSFET 22, and a CMOS inverter 26 which consists of a p channel MOSFET 24 and an n channel MOSFET 25. The input terminal of the CMOS inverter 23 is connected to the output terminal of the CMOS inverter 26, and the output terminal of the CMOS inverter 23 is connected to the input terminal of the CMOS inverter 26. That is, the CMOS inverters 23 and 26 constitute a cross-connection configuration. In addition, the potential of the input terminal of the CMOS inverter 23 is applied as the substrate bias of the CMOS inverter 23 and that of the input terminal of the CMOS inverter 26 is applied as the substrate bias of the CMOS inverter 26.

Each of the transfer gates 12 and 13 consists of an n channel MOSFET and the gate thereof is connected to a word line WL. In addition, the drain of the transfer gate 12 is connected to a bit line BL and the source thereof is connected to the output terminal of the CMOS inverter 23, i.e., the drains of the MOSFET's 21 and 22. The drain of the transfer gate 13 is connected to a bit line /BL and the source thereof is connected to the output terminal of the CMOS inverter 26, i.e., the drains of the MOSFET's 24 and 25. A well or a substrate in which the transfer gate 12 is formed is connected to a well or a substrate in which the CMOS inverter 23 is formed. A well or a substrate in which the transfer gate 13 is formed is connected to a well or a substrate in which the CMOS inverter 26 is formed.

Figure 2:
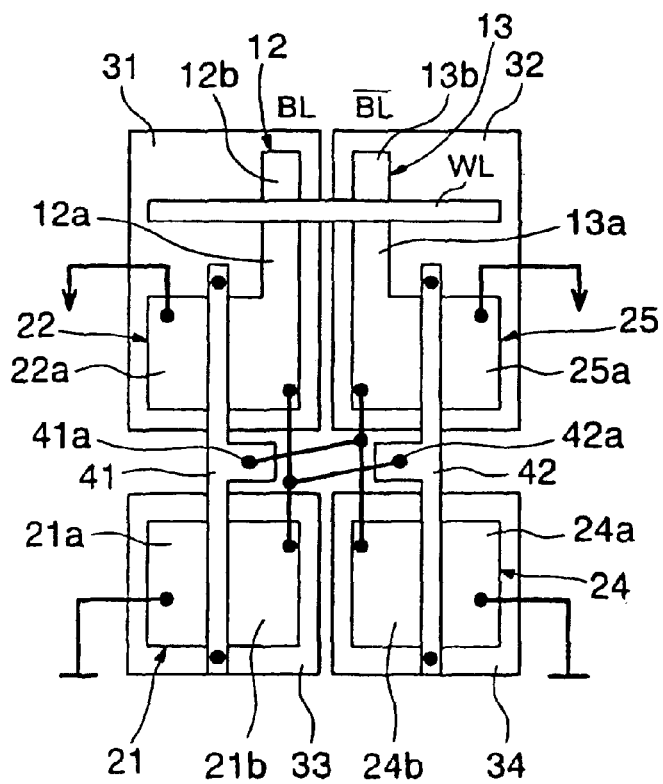
FIG. 2 is a layout of the memory cell in the first embodiment.

In the memory cell 10 constituted as stated above, the transfer gate 12 and the n channel MOSFET 22 are formed in the same well 31, the transfer gate 13 and the n channel MOSFET 25 are formed in the same well 32, the p channel MOSFET 21 is formed in a well 33 and the p channel MOSFET 24 is formed in a well 34 as shown in FIG. 2. It is noted that the wells 31, 32, 33 and 34 are isolated from one another by isolation regions.

The gates of the transfer gates 12 and 13 are constituted as a word line WL of, for example, polysilicon. A diffused layer 12b which becomes the drain of the transfer gate 12 is connected to the bit line BL and a diffused layer 12a which becomes the source of the transfer gate 12 becomes the drain of the MOSFET 22. A diffused layer 13b which becomes the drain of the transfer gate 13 is connected to the bit line/BL and a diffused layer 13a which becomes the source of the transfer gate 13 becomes the drain of the MOSFET 25. Diffused layers 22a and 25a which become the sources of the MOSFET's 22 and 25 are connected to a ground power supply by wirings, respectively. In addition, the diffused layers 12a, 12b, and 22a are formed in the well 31, and the diffused layers 13a, 13b, and 25a are formed in the well 32. The diffused layer 13a is formed into L shape in the well 32, and the diffused layer 12a is formed into L shape in the well 31. The word line WL is formed to extend laterally in FIG. 2. The diffused layers 12a and 12b are formed in regions of the well 31 on the both sides of the word line WL, respectively. The diffused layers 13a and 13b are formed in regions of the well 32 on the both sides of the word line WL, respectively.

Further, the gates of the MOSFET's 21 and 22 are constituted as a wiring 41 of, for example, polysilicon. This wiring 41 is connected to the wells 31 and 33 and also connected to diffused layers 24b and 13a which become the drains of the MOSFET's 24 and 25 by the other wirings, respectively. The gates of the MOSFET's 23 and 24 are constituted as a wiring 42 of, for example, polysilicon. This wiring 42 is connected to the wells 32 and 34 and also connected to diffused layers 21b and 12a which become the drains of the MOSFET's 21 and 22 by the other wirings, respectively. Diffused layers 21a and 24a which become the sources of the MOSFET's 21 and 24, respectively, are connected to a driving power supply. The other wirings which connect the gate 41 to the diffused layers 13a and 24b are brought into contact with the gate 41 by a contact section 41a. The other wirings which connect the gate 42 to the diffused layer 12a and 21b are brought into contact with the gate 42 by a contact section 42a. The contact section 41a is formed in the isolation region which isolates the well 31 from the well 33, and the contact section 42a is formed in the element isolation region which isolates the well 32 from the well 34. The contact sections 41a and 42a are arranged to be opposed to each other. In addition, the word line WL is formed to be almost orthogonal to the gates 41 and 42.

Figure 3A:
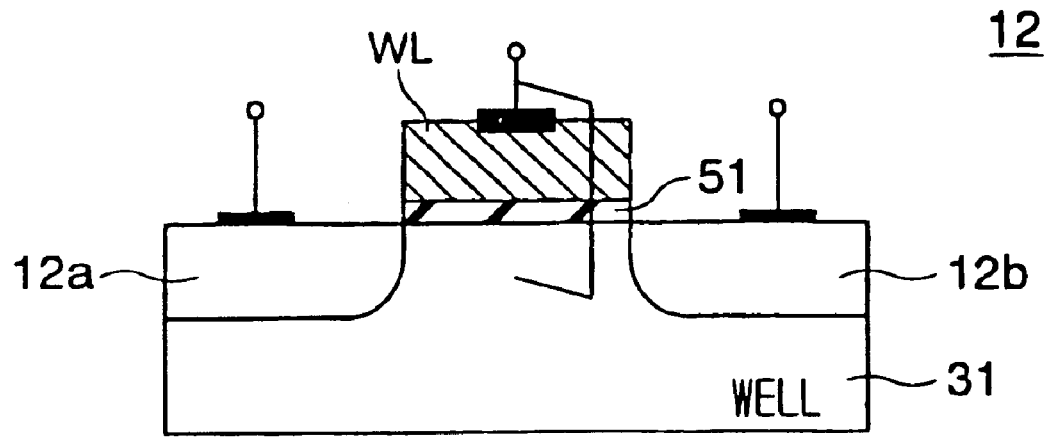
FIGS. 3A and 3B are cross-sectional views showing the configuration of a transfer gate in the first embodiment.
Figure 3B:
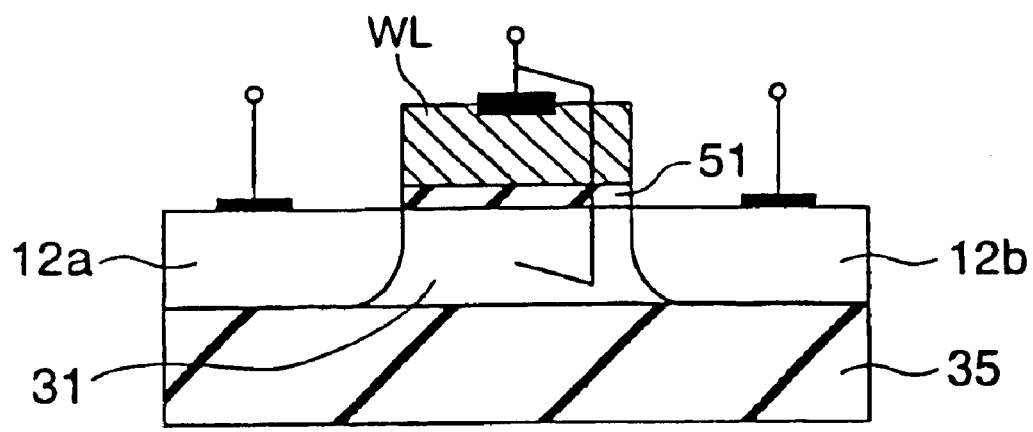

The semiconductor memory device according to this embodiment can be formed on an ordinary semiconductor substrate (e.g., a silicon substrate) or an SOI (Silicon On Insulator) substrate. The cross-sectional views of the configuration of the transfer gate 12 if the semiconductor memory device is formed on the ordinary or silicon substrate and on the SOI substrate are shown in FIGS. 3A and 3B, respectively.

The data read operation of the semiconductor memory device in this embodiment constituted as stated above will next be described. If data held in the data storage section 20 is at "L" level, i.e., the potential of the output terminal of the CMOS inverter 23 is at "L" level, then the potential levels of the bit lines BL and /BL are first raised to "H" level, respectively. Next, the potential level of the word line WL is raised to "H" level and the transfer gates 12 and 13 turn into an ON state. At this moment, the data held in the storage section 20 is at "L" level. Therefore, the substrate bias of the transfer gate 12 is at "H" level and the threshold Vth of the transfer gate 12 decreases, accordingly. As a result, the current gain of the transfer gate 12 increases. However, since the substrate bias of the other transfer gate 13 is at "L" level, the threshold Vth of the transfer gate 13 does not decrease and the current gain can be thereby suppressed.

In the first embodiment, since the two transfer gates 12 and 13 differ in operating characteristic, the semiconductor memory device can perform high speed operation. Further, in this embodiment, since the transfer gate 12 and the MOSFET 22 are formed in the same well 31 and the transfer gate 13 and the MOSFET 25 are formed in the same well 32, it is possible to decrease a cell area compared with that of the conventional semiconductor memory device which employs DTMOS's.

As stated so far, the semiconductor memory device in the first embodiment can prevent the cell area from increasing as much as possible and can perform higher speed operation than the conventional memory.

In the first embodiment, the gates of the MOSFET's 21, 22, 24 and 25 and those of the transfer gates 12 and 13 may be made of metal.

Second Embodiment

Figure 4:
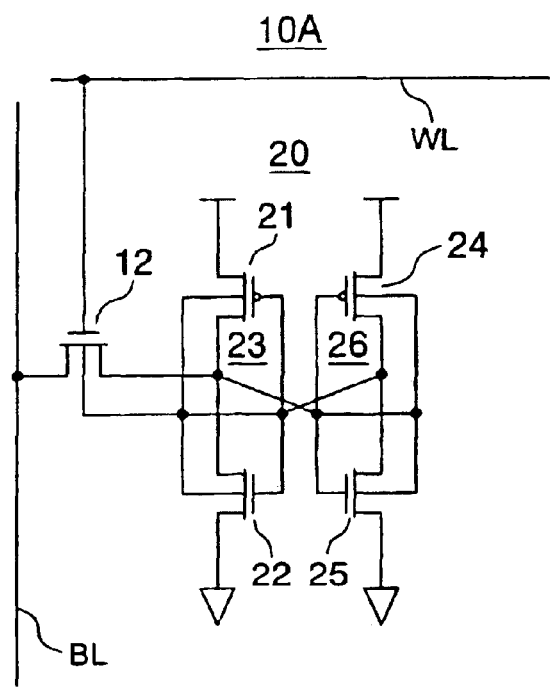
FIG. 4 is a circuit diagram showing the configuration of a memory cell in a semiconductor memory device according to the second embodiment of the present invention.

A semiconductor memory device according to the second embodiment of the present invention will be described with reference to FIG. 4. FIG. 4 is a circuit diagram showing the configuration of a memory cell in the semiconductor memory device according to the second embodiment. The memory cell 10A in the semiconductor memory device according to the second embodiment differs from the memory cell 10 in the first embodiment in that the transfer gate 13 and the bit line/BL connected to the transfer gate 13 are deleted.

In the semiconductor memory device according to this embodiment as in the case of the first embodiment, if held data is at "L" level, the substrate bias of the transfer gate 12 is at "H" level and the threshold Vth of the transfer gate 12 thereby decreases. As a result, the current gain of the transfer gate 12 increases. Therefore, high speed operation can be performed. In addition, a memory cell area can be made smaller than that in the first embodiment.

Third Embodiment

Figure 5:
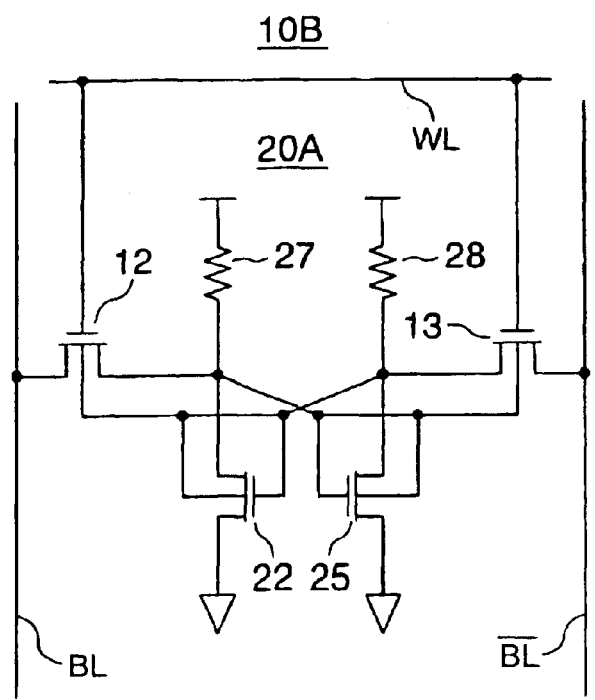
FIG. 5 is a circuit diagram showing the configuration of a memory cell in a semiconductor memory device according to the third embodiment of the present invention.

A semiconductor memory device according to the third embodiment of the present invention will be described with reference to FIG. 5. FIG. 5 is a circuit diagram showing the configuration of a memory cell in the semiconductor memory device according to the third embodiment. The memory cell 10B in the semiconductor memory device according to the third embodiment differs from the memory cell 10 in the first embodiment in that the data storage section 20 is replaced by a data storage section 20A. This data storage section 20A is constituted so that the MOSFET's 21 and 24 of the data storage section 20 are replaced by resistors 27 and 28, respectively.

The semiconductor memory device according to the third embodiment as in the case of the first embodiment can prevent a cell area from increasing as much as possible and can perform high speed operation.

Even if the transfer gate 13 and the bit line/BL are deleted from the semiconductor memory device in the third embodiment, the same advantage as that of the second embodiment can be obtained.

Fourth Embodiment

Figure 6:
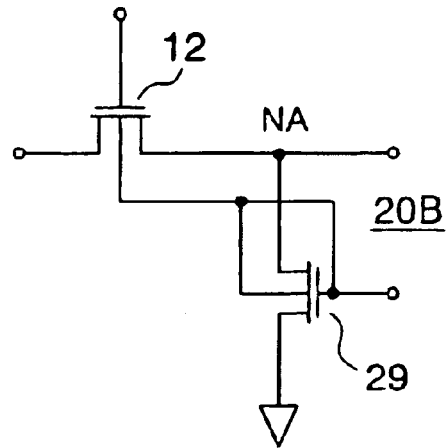
FIG. 6 is a circuit diagram showing the configuration of a memory cell in a semiconductor memory device according to the fourth embodiment of the present invention.

A semiconductor memory device according to the fourth embodiment of the present invention will be described with reference to FIG. 6. FIG. 6 is a circuit diagram showing the configuration of a memory cell 10C in the semiconductor memory device according to the fourth embodiment. This memory cell 10C includes a transfer gate 12 and a data storage section 20B. The gate of the transfer gate 12 is connected to a word line, not shown, and the drain thereof is connected to a bit line, not shown. The data storage section 20B includes an n channel MOSFET 29 and a node NA. The source of the MOSFET 29 is grounded, the drain thereof is connected to the source of the transfer gate 12 through the node NA, and the gate thereof is connected to a substrate or a well in which the MOSFET 29 and the transfer gate 12 are formed.

In the memory cell 10C constituted as stated above, if the potential of the node NA is at "H" level, the gate of the MOSFET 29 is at "L" level and an "L"-level bias is applied to the substrate in which the MOSFET 29 and the transfer gate 12 are formed. Due to this, it is possible to suppress the stand-by currents of the transfer gate 12 and the MOSFET 29 compared with the conventional memory cell which employs DTMOS's. In addition, if the NA node is at "L" level, the gate of the MOSFET 29 is at "H" level and an "H"-level bias is applied to the substrate in which the MOSFET 29 and the transfer gate 12 are formed. At this time, the thresholds Vth of the transfer gate 12 and the MOSFET 29 decrease. Therefore, if the transfer gate 12 is in an ON state, the current gain of the transfer gate 12 can be increased. It is thereby possible to perform high speed operation.

As can be seen, the fourth embodiment differs from the conventional art in that DTMOS characteristic is effectively utilized according to the value held by the node NA. Further, by applying a uniform substrate bias, it is possible to form the transfer gate 12 and the MOSFET 29 in the same well.

As stated so far, the semiconductor memory device according to the fourth embodiment can prevent a cell area from increasing as much as possible and can perform higher speed operation than the conventional memory.

Fifth Embodiment

Figure 7:
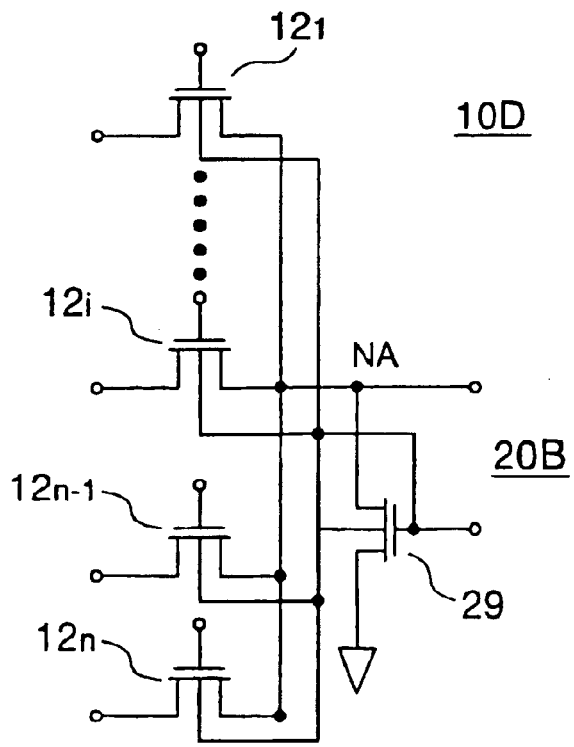
FIG. 7 is a circuit diagram showing the configuration of a memory cell in a semiconductor memory device according to the fifth embodiment of the present invention.
Figure 8:
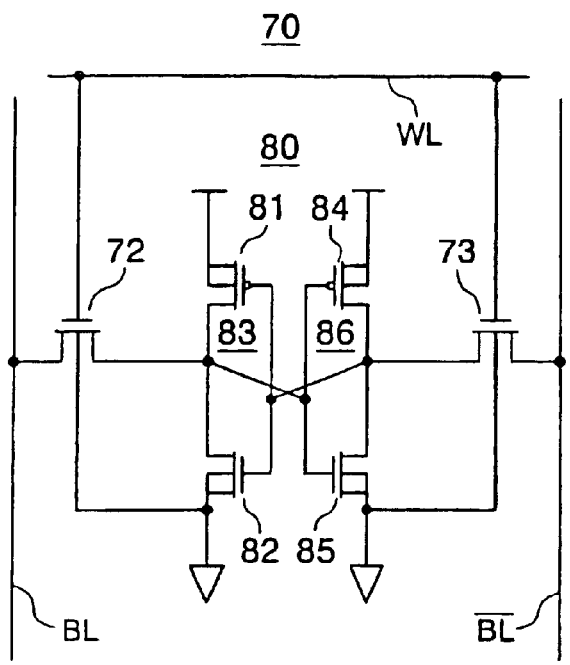
FIG. 8 is a circuit diagram showing the configuration of a memory cell according to a conventional semiconductor memory device.
Figure 9:
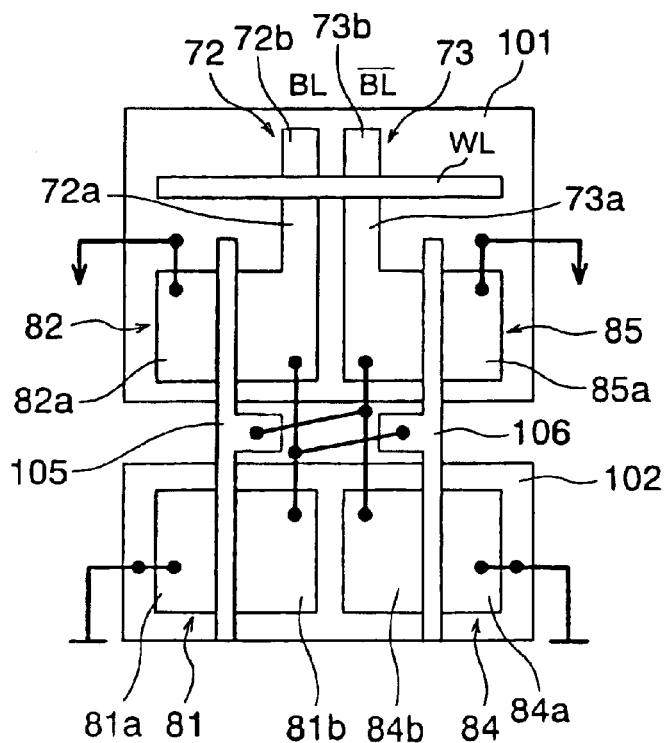
FIG. 9 is a layout of the memory cell shown in FIG. 8.
Figure 10:
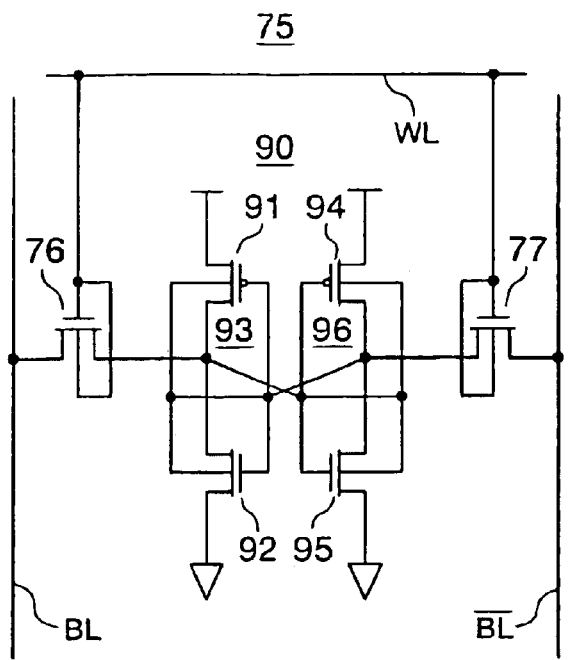
FIG. 10 is a circuit diagram showing the configuration of a memory cell according to another conventional semiconductor memory device.
Figure 11:
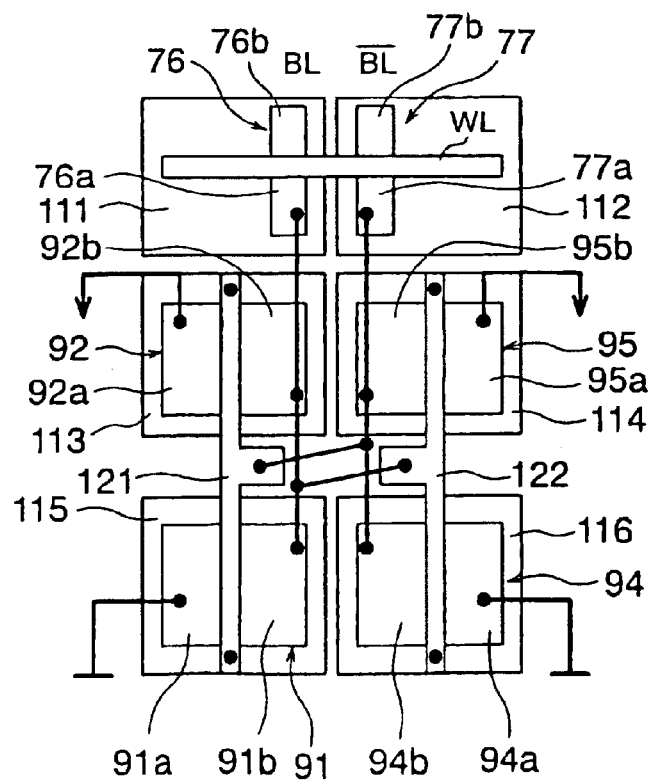
FIG. 11 is a layout of the memory cell shown in FIG. 10.

A semiconductor memory device according to the fifth embodiment of the present invention will be described with reference to FIG. 7. FIG. 7 is a circuit diagram showing the configuration of a memory cell 10D in the semiconductor memory device according to the fifth embodiment. The memory cell 10D differs from the memory cell 10C in the fourth embodiment in that the transfer gate 12 is replaced by a plurality of transfer gates $12_1, \ldots$ and $12_n$ ($n \geq 2$) each consisting of an n channel MOSFET.

The sources of the transfer gates $12_i$ (i=1, ..., n) are connected to the node NA, the drains thereof are connected to a common bit line, not shown, and the gates thereof are connected to different word lines, not shown, respectively. The memory cell in this embodiment can be used in a multi-port SRAM (Static Random Access Memory).

The semiconductor memory device according to the fifth embodiment as in the case of the fourth embodiment can prevent a cell area from increasing as much as possible and can perform higher speed operation than the conventional semiconductor memory device.

As described above, according to the present invention, it is possible to prevent the cell area from increasing as much as possible and perform higher speed operation than the conventional semiconductor memory device.

What is claimed is:

1. A semiconductor memory device comprising a plurality of memory cells each comprising:

first to fourth wells formed on a semiconductor substrate and isolated from one another;

a first MOSFET of a first conductive type formed in said first well, having a diffused layer becoming a drain and connected to one of a pair of bit lines, and having a gate connected to a word line;

a second MOSFET of the first conductive type formed in said first well, having a diffused layer becoming a drain, the diffused layer being a common diffused layer becoming a source of said first MOSFET;

a third MOSFET of the first conductive type formed in said second well, having a diffused layer becoming a drain and connected to the other bit line of the pair of bit lines, and having a gate connected to said word line;

a fourth MOSFET of the first conductive type formed in said second well, having a diffused layer becoming a drain, the diffused layer being a common diffused layer becoming a source of said third MOSFET;

a fifth MOSFET of a second conductive type formed in said third well, and having a gate common to the fifth MOSFET and said second MOSFET;

a sixth MOSFET of the second conductive type formed in said fourth well, and having a gate common to the sixth MOSFET and said fourth MOSFET;

a first wiring connecting a diffused layer becoming a drain of said second MOSFET to a diffused layer becoming the drain of said fifth MOSFET;

a second wiring connecting a diffused layer becoming a drain of said fourth MOSFET to a diffused layer becoming a drain of said sixth MOSFET;

a first contact section formed in an isolation region isolating said first well from said third well, and connecting said second wiring to the gates of said second and fifth MOSFET'S; and a second contact section formed in an isolation region isolating said second well from said fourth well, and connecting said first wiring to the gates of said fourth and sixth MOSFET's, wherein said first well is connected to said third well through the gates of said second and fifth MOSFET's, and said second well is connected to said fourth well through the gates of said fourth and sixth MOSFET's.

2. The semiconductor memory device according to claim 1, wherein said first contact and said second contact section are arranged to be opposed to each other.

3. The semiconductor memory device according to claim 1, wherein the diffused layers becoming the sources of said first and third MOSFET's are L-shaped.

* * * * *